(12) United States Patent
Srinivasan et al.

(10) Patent No.: US 8,957,403 B2
(45) Date of Patent: Feb. 17, 2015

(54) SELECT DEVICES INCLUDING AN OPEN VOLUME, AND RELATED METHODS, MEMORY DEVICES, AND ELECTRONIC SYSTEMS

(71) Applicant: Micron Technology, Inc., Boise, ID (US)

(72) Inventors: Bhaskar Srinivasan, Plano, TX (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/929,348

(22) Filed: Jun. 27, 2013

(65) Prior Publication Data

US 2013/0285110 A1 Oct. 31, 2013

Related U.S. Application Data

(62) Division of application No. 13/211,036, filed on Aug. 16, 2011, now Pat. No. 8,541,770, which is a division of application No. 12/274,181, filed on Nov. 19, 2008, now Pat. No. 8,008,162.

(51) Int. Cl.
*H01L 29/06* (2006.01)
*H01L 31/00* (2006.01)
*H01L 21/02* (2006.01)
*H01L 29/88* (2006.01)
(Continued)

(52) U.S. Cl.
CPC ............ *H01L 29/88* (2013.01); *H01L 27/1021* (2013.01); *H01L 21/3205* (2013.01); *Y10S 438/957* (2013.01)

USPC ...... 257/23; 257/9; 257/12; 257/14; 257/532; 257/E29.343; 257/E29.345; 257/E29.069; 438/397; 438/957

(58) Field of Classification Search
USPC ............ 257/9, 12, 14, 23, 532, 534, E29.343, 257/E29.345, E29.069; 438/397, 957
See application file for complete search history.

(56) References Cited

U.S. PATENT DOCUMENTS 4,242,736 A 12/1980 Raffel et al.
5,512,773 A 4/1996 Wolf et al.
(Continued)

FOREIGN PATENT DOCUMENTS

CN 1485909 A 3/2004
JP 07202139 A 8/1995
(Continued)

OTHER PUBLICATIONS

International Preliminary Report on Patentability for International Application No. PCT/US2009/063761 dated May 24, 2011, 5 pages.
(Continued)

*Primary Examiner* — Robert Huber
(74) *Attorney, Agent, or Firm* — TraskBritt

(57) ABSTRACT

Select devices including an open volume that functions as a high bandgap material having a low dielectric constant are disclosed. The open volume may provide a more nonlinear, asymmetric I-V curve and enhanced rectifying behavior in the select devices. The select devices may comprise, for example, a metal-insulator-insulator-metal (MIIM) diode. Various methods may be used to form select devices and memory systems including such select devices. Memory devices and electronic systems include such select devices.

20 Claims, 8 Drawing Sheets

(51) Int. Cl.
*H01L 27/102* (2006.01)
*H01L 21/3205* (2006.01)

(56) References Cited

U.S. PATENT DOCUMENTS

| | | |
|---|---|---|
| 5,654,222 A | 8/1997 | Sandhu et al. |
| 5,869,379 A | 2/1999 | Gardner et al. |
| 6,015,746 A | 1/2000 | Yeh et al. |
| 6,064,107 A | 5/2000 | Yeh et al. |
| 6,127,251 A | 10/2000 | Gardener et al. |
| 6,140,200 A | 10/2000 | Eldridge |
| 6,306,721 B1 | 10/2001 | Teo et al. |
| 6,350,628 B1 | 2/2002 | Cheng et al. |
| 6,534,784 B2 | 3/2003 | Eliasson et al. |
| 6,635,967 B2 | 10/2003 | Chang et al. |
| 6,680,521 B1 | 1/2004 | Kar-Roy et al. |
| 6,700,771 B2 | 3/2004 | Bhattacharyya |
| 6,894,357 B2 | 5/2005 | Guo |
| 6,927,461 B2 | 8/2005 | Kim et al. |
| 6,944,052 B2 | 9/2005 | Subramanian et al. |
| 6,992,317 B2 * | 1/2006 | Jain et al. .......... 257/14 |
| 7,060,584 B1 | 6/2006 | Carns et al. |
| 7,091,052 B2 | 8/2006 | Liu |
| 7,173,275 B2 | 2/2007 | Estes et al. |
| 7,349,187 B2 | 3/2008 | Parkin |
| 7,388,276 B2 | 6/2008 | Estes |
| 7,875,883 B2 | 1/2011 | Sakamoto et al. |
| 8,519,371 B2 | 8/2013 | Fukumizu et al. |
| 2002/0089022 A1 | 7/2002 | Lutze |
| 2003/0211684 A1 | 11/2003 | Guo |
| 2004/0038489 A1 | 2/2004 | Clevenger et al. |
| 2004/0043577 A1 * | 3/2004 | Hill ................. 438/396 |
| 2004/0201057 A1 | 10/2004 | Lien et al. |
| 2005/0062074 A1 | 3/2005 | Lung |
| 2006/0038244 A1 | 2/2006 | Basceri et al. |
| 2006/0038293 A1 | 2/2006 | Rueger et al. |
| 2009/0052225 A1 | 2/2009 | Morimoto |

FOREIGN PATENT DOCUMENTS

| | | |
|---|---|---|
| JP | 2001-284534 A | 10/2001 |
| JP | 2002537650 A | 11/2002 |
| JP | 2005-123394 A | 5/2005 |
| JP | 2007-13193 A | 1/2007 |
| JP | 2009218259 A | 9/2009 |
| WO | 03038124 A1 | 5/2003 |
| WO | 2006077747 A1 | 7/2006 |
| WO | WO 2008118422 A1 * | 10/2008 |

OTHER PUBLICATIONS

International Search Report for International Application No. PCT/US2009/063761, mailed Jun. 11, 2010, 3 pages.

International Written Opinion for International Application No. PCT/US2009/063761, mailed Jun. 11, 2010, 4 pages.

Office Action for Taiwan Patent Application No. 098139393, dated Nov. 20, 2012.

Rockwell et al., "Characterization and Modeling of Metal/Double-Insulator/Metal Diodes for Millimeter Wave Wireless Receive Applications", Radio Frequency Integrated Circuits Symposium, Jun. 3-5, 2007, pp. 171-174.

\* cited by examiner

US 8,957,403 B2

SELECT DEVICES INCLUDING AN OPEN VOLUME, AND RELATED METHODS, MEMORY DEVICES, AND ELECTRONIC SYSTEMS

CROSS-REFERENCE TO RELATED APPLICATION

This application is a divisional of U.S. patent application Ser. No. 13/211,036, filed Aug. 16, 2011, now U.S. Pat. No. 8,541,770, issued Sep. 24, 2013, which application is a divisional of U.S. patent application Ser. No. 12/274,181, filed Nov. 19, 2008, now U.S. Pat. No. 8,008,162, issued Aug. 30, 2011, the disclosure of each of which is hereby incorporated herein in its entirety by this reference.

FIELD

Embodiments of the invention generally relate to select devices, such as metal-insulator-insulator-metal (MIIM) diodes, that include an open volume, memory devices and electronic systems including such select devices, and to methods of fabricating such select devices.

BACKGROUND

A metal-insulator-insulator-metal (MIIM) diode includes two electrical insulators disposed between two types of metals. The materials are tailored such that responsive to application of a forward bias, a quantum well forms between the two insulators enabling high-energy quantum tunneling. As a result, when a voltage is applied to the top metal that exceeds its threshold, tunneling electrons are accelerated across the quantum well. Quantum tunneling is faster than charging a switch junction in an integrated circuit, partially because charge travels through the metal rather than slower speed materials such as silicon.

MIIM diodes can be broadly incorporated within circuits that use conventional CMOS manufacturing as well as other semiconductor and printed circuit technologies. The MIIM diode has a sharper forward current-to-voltage (I-V) curve than the metal-insulator-metal (MIM) diode and, thus, may be used as a tunneling device with very high-speed performance capability that is potentially compatible with many substrate technologies. Use of MIIM diodes may potentially reduce cost, size, and improve performance of high-speed memory devices.

However, the insulator materials used in MIIM diodes must be relatively thin compared to the de Broglie electron wavelength and, thus, conventional deposition processes may cause undesirable chemical intermixing at the interface of the metals and insulators. Moreover, for the MIM to function as a diode, there must be a preferred tunneling direction that results in a sharp bend in the diode forward characteristic current-voltage (I-V) curve. As a result of the high electric fields at the contact periphery or interface current caused by electron traps at the metal-insulator interface, significant edge leakage may occur in MIIM diodes. Due to high leakage currents, MIIM diodes may generally exhibit poor rectifying behavior. Increased asymmetry and nonlinearity in the I-V performance as might be achieved through avoidance of the aforementioned chemical intermixing and edge leakage exhibited by select devices as exemplified by conventional MIIM diodes would result in better rectification performance of such devices.

In view of the above, there is a need in the art for select devices that may be scaled to smaller sizes while exhibiting an increased asymmetrical I-V curve and associated improved rectifying behavior, as well methods of forming such select devices.

DETAILED DESCRIPTION

As discussed in further detail below, in some embodiments, the present invention comprises methods of fabricating select devices, such as metal-insulator-insulator-metal (MIIM) devices, including an open volume that functions as an insulator. In additional embodiments, the present invention comprises memory devices and electronic systems that include one or more such select devices. The one or more such select devices may be in electrical communication with a memory cell to form a memory device. In other embodiments, the present invention includes methods of forming such select devices. Such methods may include forming an open volume between a conductive material and an insulator material, the open volume functioning as a high bandgap insulator having a low dielectric constant.

The "select device," as used herein, means and includes a device that may operate as a switch that is either in an "off" state or an "on" state depending on the amount of voltage potential applied and, more particularly, switches to the on state when the applied current reaches a threshold or current voltage and in the off state may exhibit a substantially electrically nonconductive state.

As used herein, the teem "substrate" means any structure that includes a layer of semiconductor type material including, for example, silicon, germanium, gallium arsenide, indium phosphide, and other III-V or II-VI type semiconductor materials. Substrates include, for example, not only conventional substrates but also other bulk semiconductor substrates such as, by way of non-limiting example, silicon-on-insulator (SOI) type substrates, silicon-on-sapphire (SOS) type substrates, and epitaxial layers of silicon supported by a layer of base material. Semiconductor type materials may be doped or undoped. Furthermore, when reference is made to a "substrate" in the following description, previous process steps may have been utilized to at least partially form elements or components of a circuit or device in or over a surface of the substrate.

The illustrations presented herein are not meant to be actual views of any particular select device, memory device, memory cell, or system, but are merely idealized representations that are employed to describe the present invention. Additionally, elements common between figures may retain the same numerical designation.

Figure 1A:
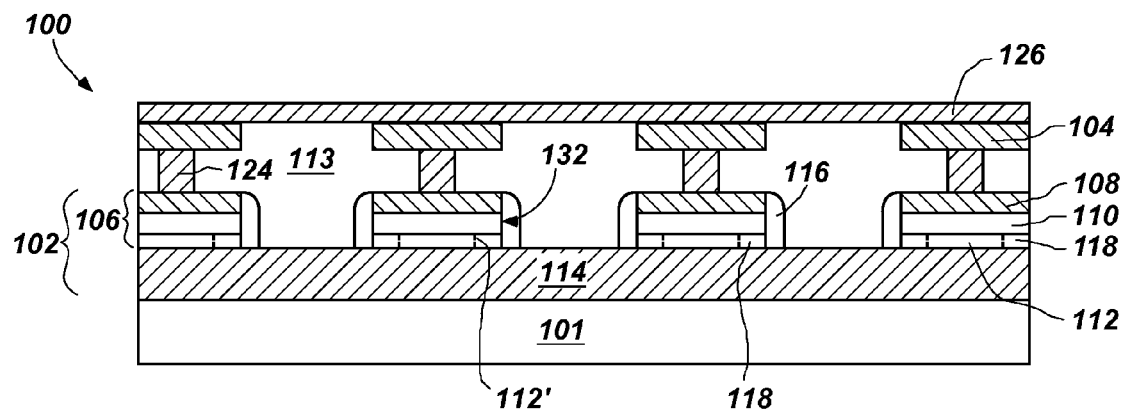
FIG. 1A is a partial cross-sectional side view illustrating an embodiment of a memory device of the present invention including select devices according to the present invention.

FIG. 1A is a partial cross-sectional schematic view of an embodiment of a memory device 100 of the present invention. The memory device 100 may include an integrated circuit comprising a plurality of select devices 102, each of which is coupled to a memory cell 104. In some embodiments, the select devices 102 and memory cells 104 may be arranged in an array on or in a substrate 101. By way of example and not limitation, the select devices 102 may be arranged in a plurality of rows and columns. FIG. 1A is a partial cross-sectional view taken vertically through the substrate 101 and illustrates four select devices 102 in a common row or column of the array.

Each of the select devices 102 may include conductive material 114, and a structure 106 disposed thereon, the structure 106 comprising an optional dielectric material 112, another dielectric material 110, another conductive material 108, and at least one open volume 118 within the select device 102. To facilitate illustration, the select devices 102 are shown in FIG. 1A as occupying a major vertical portion of the substrate 101. It is understood, however, that in actuality the substrate 101 may be relatively thicker than illustrated, and the select devices 102 may occupy a relatively thinner portion of the substrate 101. Furthermore, only active elements of the select devices 102 (i.e., the elements of the select devices 102 through which charge carriers travel), or materials used to form such active elements, are cross-hatched to simplify the cross-sectional figures herein.

The select devices 102 may be disposed, for example, within another dielectric material 113. Each select device 102 may, optionally, be in physical or electrical contact with memory cell 104 via, for example, a conductive contact 124. In some embodiments, each select device 102 may communicate electrically with a memory cell 104 by way of a conductive contact 124, and each memory cell 104 may communicate electrically with a conductive line 126. As a non-limiting example, each of the memory cells 104 may include a charge-based memory cell or a phase change memory cell. Each select device 102 may also communicate electrically with another conductive line (not shown) by way of electrical contacts (not shown). In additional embodiments, the conductive material 114 may simply comprise a region or portion of another conductive line.

Figure 1B:
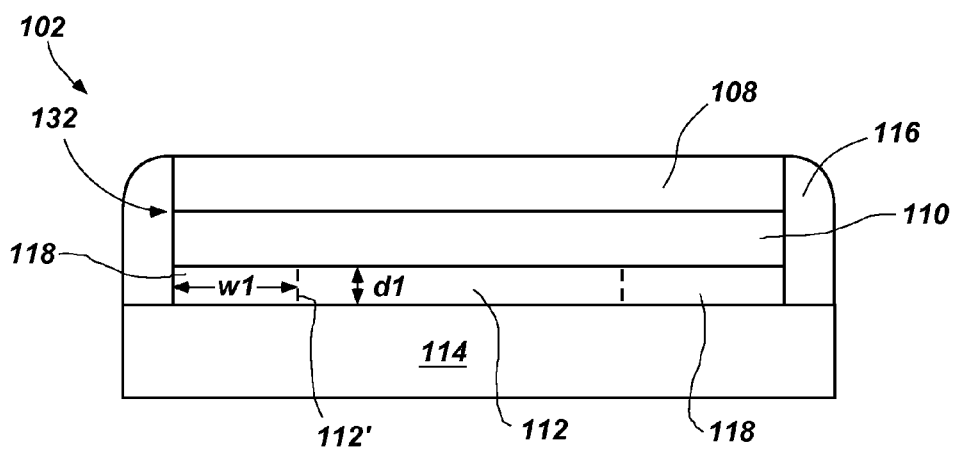
FIG. 1B shows electrodes, insulators and spacers of one select device shown in FIG. 1A and is used to illustrate one manner of operation thereof.

FIG. 1B is an enlarged view of the conductive material 114, the optional dielectric material 112, the another dielectric material 110, the another conductive material 108, and the open volume 118 of one select device 102 shown in FIG. 1A. Spacers 116 may be disposed on the conductive material 114, overlying sidewalls 132 of the another conductive material 108, the another dielectric material 110, and the optional dielectric material 112. By way of non-limiting example, the open volume 118 may have an average depth, which is depicted as d1, of between about 5 Å and about 20 Å, and more particularly about 10 Å. The open volume 118 of each select device 102 may, for example, extend into the dielectric material 112', as shown in broken lines in FIG. 1B. The width of the open volume 118, which is depicted as w1, may be selected, for example, based on the composition of the dielectric material 112', and the another dielectric material 110, and based on a thickness of the overlying another conductive material 108. In additional embodiments, the dielectric material 112' may be absent and the open volume 118 may substantially extend between adjacent spacers 116 to form a void between opposing surfaces of the another dielectric material 110 and the conductive material 114.

As the select device 102 is scaled to smaller devices sizes, the edge (i.e., an outer periphery) of the select device 102 forms a greater percentage of the total area of the select device 102 resulting in increased edge leakage, which may have negative effects on the rectifying behavior of the select device 102. To compensate for increased edge leakage, the open volume 118 may be provided, with open volume 118 functioning as a high band gap insulator having a dielectric constant of about one (1). Including the open volume 118 as an insulator in the select device 102 enables smaller scaling of the select devices 102 while minimizing fringe field effects (i.e., edge leakage) and providing a select device 102 exhibiting a larger asymmetrical current and an enhanced rectifying behavior.

Figure 2:
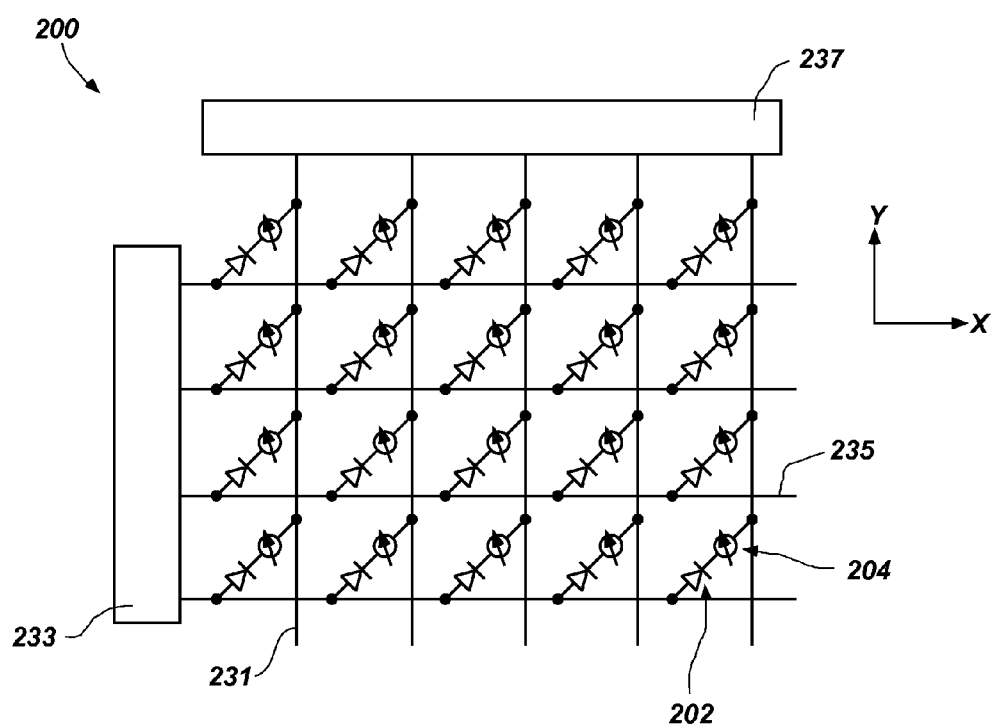
FIG. 2 is a diagram of a memory device of the present invention in which select devices according to the present invention are disposed in a simple matrix form.

As shown in FIG. 2, the memory device 200 may include an array of memory cells 204, each of which is coupled to a select device 202 arranged in a simple matrix form, for selectively writing information to the array of memory cells 204, or selectively reading information from the array of memory cells 204, and various circuits that include, for example, a first electrode 231, a first drive circuit 233 for selectively controlling the first electrode 231, a second electrode 235, a second drive circuit 237 for selectively controlling the second electrode 235, and a signal detection circuit (not shown).

The first electrodes 231 may substantially function as wordlines for line selection and second electrodes 235 may substantially function as bit lines for a row selection arranged orthogonally to the first electrodes 231. Specifically, the first electrodes 231 are arranged in a major plane of memory device 200 at a predetermined pitch in direction X and the second electrodes 235 are arranged at a predetermined pitch in direction Y orthogonal to direction X. In additional embodiments, the first and second electrodes 231 and 235, respectively, may be reversed so that first electrodes 231 may substantially function as bit lines while the second electrodes 235 substantially function as wordlines.

Figure 3A:
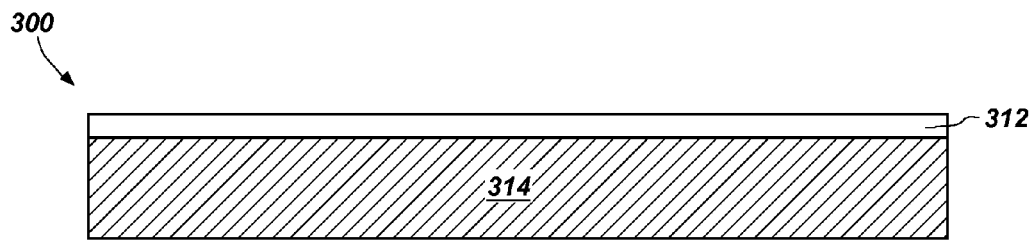
FIGS. 3A-3F are partial cross-sectional side views of embodiments of a workpiece and illustrate an embodiment of a method of forming the select device shown in FIGS. 1A and 1B.

An embodiment of a method that may be used to form a select device 102 such as that shown in FIG. 1 is described with reference to FIGS. 3A-3F. Referring to FIG. 3A, a workpiece 300 may be provided, which includes a conductive material 314 and a dielectric material 312. The conductive material 314 may comprise a metal having a low work function, such as, for example, tantalum silicide ($TaSi_2$), an alloy of tantalum and silicon, an alloy of tantalum and nitrogen, and may be formed using, for example, metal layer deposition techniques (e.g., chemical vapor deposition (CVD), physical vapor deposition (PVD), sputtering, thermal evaporation, or plating) as known in the art of integrated circuit fabrication. In some embodiments, the conductive material 314 may be formed over a substrate (not shown), which, as previously described, may comprise a full or partial wafer of semiconductor material or a material such as glass or sapphire. Additional features, such as, for example, conductive lines (which may simply comprise conductive pads in additional embodiments) and electrical contacts, also may be formed on or in the surface of the substrate in a similar manner (prior and/or subsequent to framing the conductive material 314), although a substrate including such additional features is not illustrated in FIGS. 3A-3F in order to simplify the figures.

The dielectric material 312 may be provided over the workpiece 300 (i.e., over an exposed major surface of the conductive material 314) and may have a thickness of less than about 1 nm and, more particularly, between about 5 Å and about 20 Å. By way of example and not limitation, the dielectric material 312 may comprise a material having a dielectric constant (∈) of between about 2 to about 10, and having a band gap of between about 6 eV and about 10 eV. For example, the dielectric material 312 may include an oxide such as silicon dioxide ($SiO_2$), a nitride such as silicon nitride ($Si_3N_4$), amorphous carbon, or aluminum oxide ($Al_2O_3$), and may be formed using a chemical vapor deposition (CVD) process, by decomposing tetraethyl orthosilicate (TEOS), by a spin-on process, or by any other process known in the art of integrated circuit fabrication.

Figure 3B:
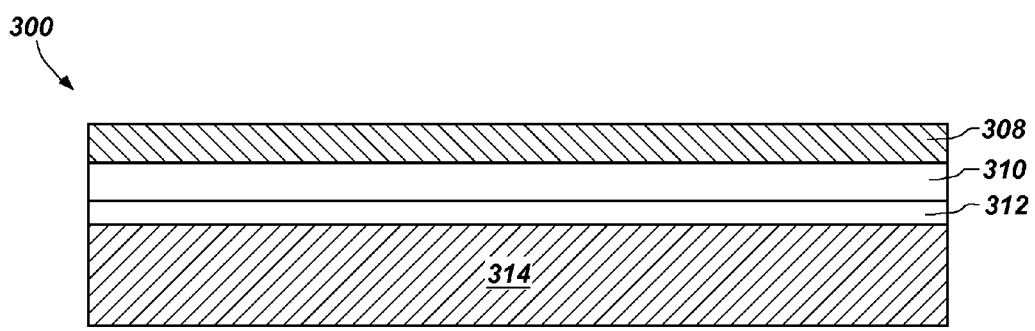

Referring to FIG. 3B, another dielectric material 310 may be formed over and in contact with the dielectric material 312. The another dielectric material 310 may include, for example, a crystalline material and include hafnium, zirconium, titanium, tellurium, oxides thereof, combinations thereof, and alloys thereof. By way of non-limiting example, the another dielectric material 310 may be formed to have a thickness of between about 2 nm and about 8 nm and, more particularly about 5 nm, using a conventional process such as an atomic layer deposition (ALD) process, a chemical vapor deposition (CVD) process, or a physical vapor deposition (PVD) process. In some embodiments, the another dielectric material 310 may include multiple layers (not shown) that may be, for example, deposited using an atomic layer deposition (ALD) process to form a laminated or sandwiched structure.

Another conductive material 308 may be formed over the another dielectric material 310 and may comprise, for example, a metal having a high work function such as platinum, titanium, titanium nitride, rhodium, iridium, ruthenium, combinations thereof, and alloys thereof. The another conductive material 308 may have an average thickness of between about 5 nm to about 30 nm and, more particularly, about 10 nm to about 20 nm, may be formed by using, for example, a physical vapor deposition (PVD) process (e.g., sputtering or thermal evaporation), a chemical vapor deposition (CVD) process, an electroless deposition process, or an electroless deposition process used to form a seed layer followed by a subsequent electroplating process.

Figure 3C:
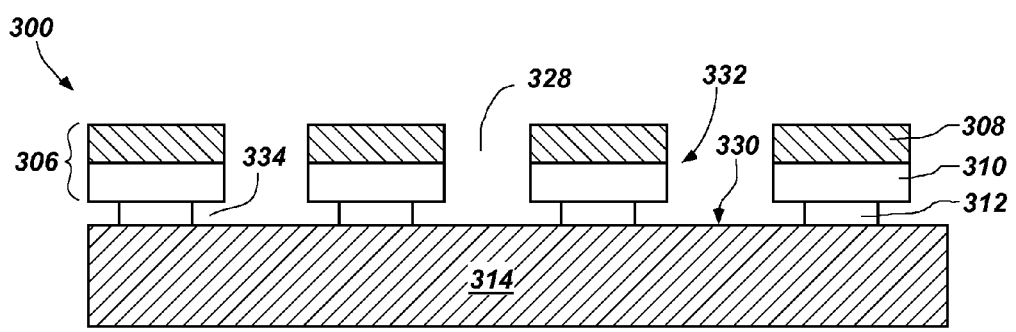

As shown in FIG. 3C, openings 328 may be formed through the another conductive material 308, the another dielectric material 310, and the dielectric material 312 forming structures 306 and exposing sidewalls 332 of each of the another conductive material 308, the another dielectric material 310, and the dielectric material 312. Although FIG. 3C shows a plurality of openings 328 to simplify the cross-sectional figures, a single opening 328 may be formed. As a non-limiting example, each of the openings 328 may be formed by removing a portion of each of the another conductive material 308, the another dielectric material 310, and the dielectric material 312 through an aperture in a mask (not shown) using, for example, an anisotropic dry reactive ion (i.e., plasma) etching process. The mask may be, for example, a photoresist material or a dielectric anti-reflective coating (DARC) material. Removal of a portion of each of the another conductive material 308, the another dielectric material 310, and the dielectric material 312 may expose a surface 330 of the conductive material 314. The particular composition of the etchant used to form the openings 328 may be selected based on the composition of the another conductive material 308, the another dielectric material 310, the dielectric material 312, the conductive material 314, and the mask. As a non-limiting example, the another conductive material 308 may be platinum, the another dielectric material 310 may be amorphous carbon, the dielectric material 312 may be silicon dioxide, and the conductive material 314 may be tantalum nitride. A chlorine-containing etchant may be introduced to be used to selectively remove the another conductive material 308, the another dielectric material 310, the dielectric material 312 through apertures in the mask forming the openings 328.

Referring still to FIG. 3C, another portion of the dielectric material 312 may be removed to form undercuts 334 in the dielectric material 312, each of the undercuts 334 exposing opposing surfaces of the another dielectric material 310 and the conductive material 314. The undercuts 334 may be formed using an anisotropic wet etching process or an anisotropic dry (i.e., reactive ion) etching process. By way of non-limiting example, the another conductive material 308 is platinum, the another dielectric material 310 is hafnium oxide, and the dielectric material 312 is silicon dioxide, and the conductive material 314 is tantalum nitride, and a solution including water and hydrofluoric acid at a ratio of between about 500:1 and about 100:1 may be applied to the sidewalls 332 to form undercuts 334 in the silicon dioxide. Additionally, the dielectric material 312 may be formed from amorphous carbon and may be exposed to an oxygen plasma to form the undercuts 334 therein.

Figure 3D:
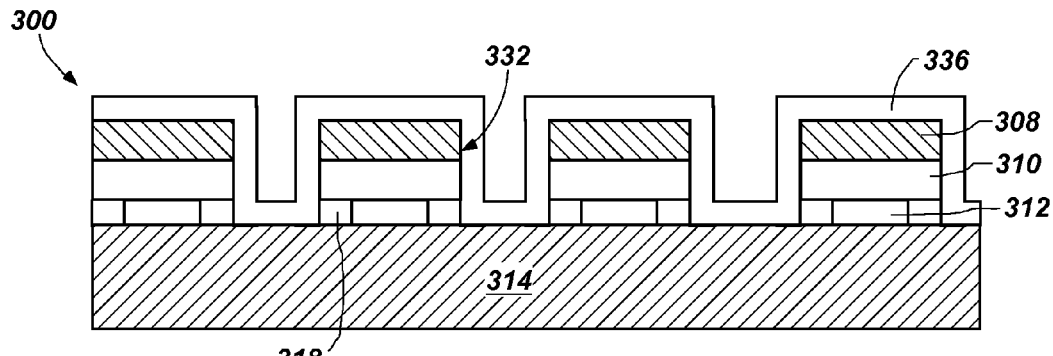

As shown in FIG. 3D, after forming the undercuts 334, a spacer material 336 may be deposited over the workpiece 300 (i.e., over exposed surfaces of the another conductive material 308 and the conductive material 314 and over sidewalls 332 of the openings 328) to form an open volume 318 defined by surrounding surfaces of the spacer material 336, the dielectric material 312, the another dielectric material 310 and the conductive material 314. The spacer material 336 may include, for example, silicon dioxide or silicon nitride and may be formed using an atomic layer deposition (ALD) process, or a chemical vapor deposition (CVD) process. By way of example and not limitation, a conformal layer (not shown) of the spacer material 336 may be deposited over the workpiece 300 to a thickness sufficient to provide support for the open volume 318.

Figure 3E:
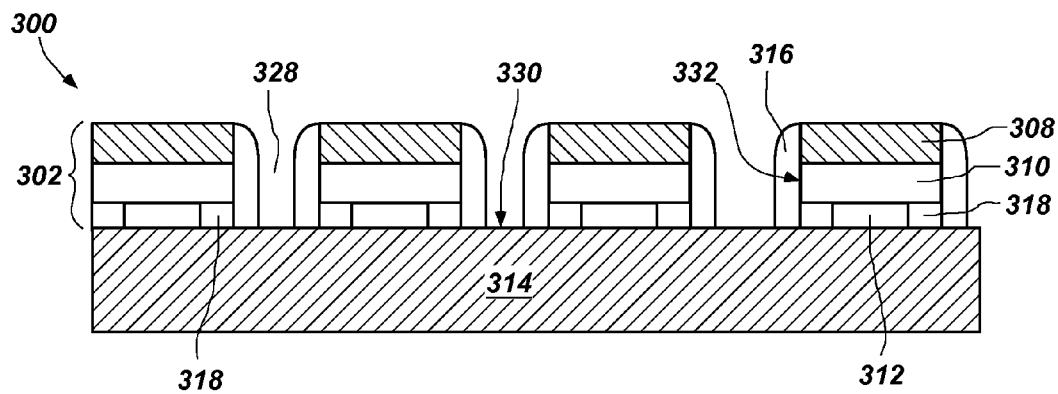

A portion of the spacer material 336 may then be removed to form spacers 316 disposed about a periphery of select devices 302, such as those shown in FIG. 3E. The spacers 316 may be formed using a conventional anisotropic etching process, which is not described in detail herein. As a non-limiting example, the spacer material 336 may include silicon nitride and a plasma etching process may be performed using a mixture of hydrogen bromide (HBr) and sulfur hexafluoride ($SF_6$) to form spacers 316 laterally sealing the open volume 318. Each of the spacers 316 may extend from the surface 330 of the conductive material 314 overlying sidewalls 332.

Figure 3F:
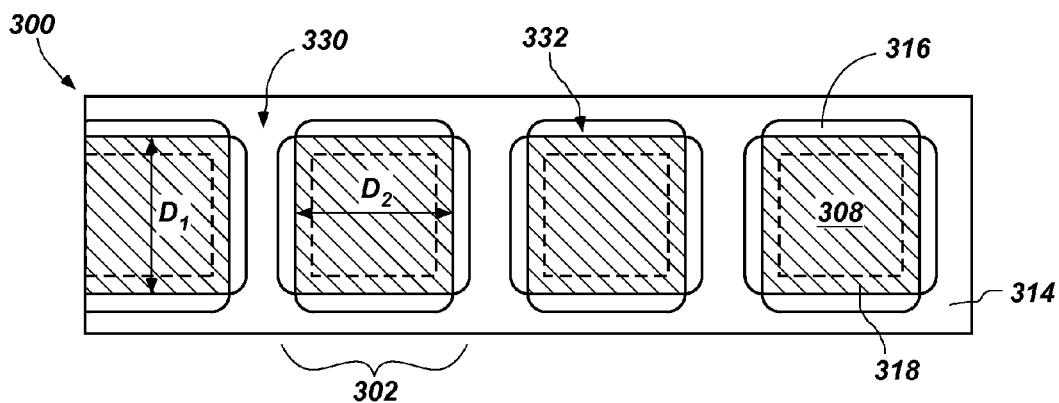

FIG. 3F shows a top-down view of the workpiece 300 shown in FIG. 3E, which includes a plurality of select devices 302, each of the select devices 302 including portions of the another conductive material 308, the dielectric material 312 (not visible) and the another dielectric material 310 (not visible), which are disposed over the conductive material 314. The open volume 318, which is represented in FIG. 3F by broken lines, is disposed about an outer periphery of the another conductive material 308. Each of the select devices 302 may have lateral dimensions $D_1$ and $D_2$ of between about 25 nm and about 75 nm and, more particularly, about 50 nm. Spacers 316 are positioned on the surface 330 of the conductive material 314 overlying sidewalls 332.

Formation of the open volume 318 provides an insulator having a dielectric constant (∈) of about 1, which facilitates formation of select devices 302 having enhanced rectifying behavior, even at smaller device sizes. The processes utilized in the formation of the open volume 318 may be performed at sufficiently low temperatures so as to prevent chemical intermixing between the dialectic materials (i.e., the another dielectric material 310 and the dielectric material 312) and the conductive materials (i.e., the another conductive material 308 and the conductive material 314).

Figure 4A:
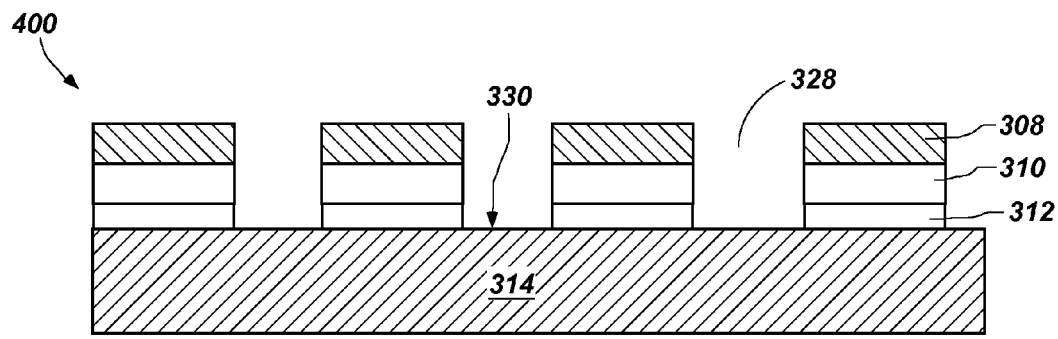
FIGS. 4A-4F are partial cross-sectional side views of embodiments of a workpiece and illustrate another embodiment of a method of forming the select device shown in FIGS. 1A and 1B.

Another embodiment of a method that may be used to form a select device 102 such as that shown in FIGS. 1A and 1B is described below with reference to FIGS. 4A-4F. As shown in FIG. 4A, a workpiece 400 may be provided that includes openings 328 formed exposing a surface 330 of a conductive material 314 through a dielectric material 312, and another dielectric material 310, and another conductive material 308. The workpiece 400 shown in FIG. 4A may be formed in the manner previously described with reference to FIGS. 3A-3C.

Figure 4B:
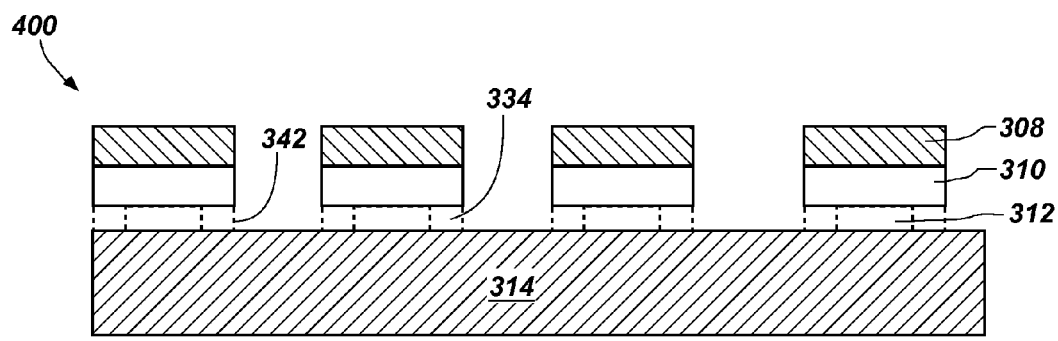

Referring to FIG. 4B, another portion of the dielectric material 312 may, optionally, be removed to form undercuts 334 in the dielectric material 312 using methods identical or substantially similar to those previously described in relation to FIG. 3C. Thereafter, a sacrificial material 342, which is represented by broken lines, may optionally be applied to at least partially fill each of the undercuts 334. By way of non-limiting example, the sacrificial material 342 may be formed from a hard mask material, such as amorphous carbon, and may be deposited using conventional methods such as an atomic layer deposition (ALD) process.

Figure 4C:
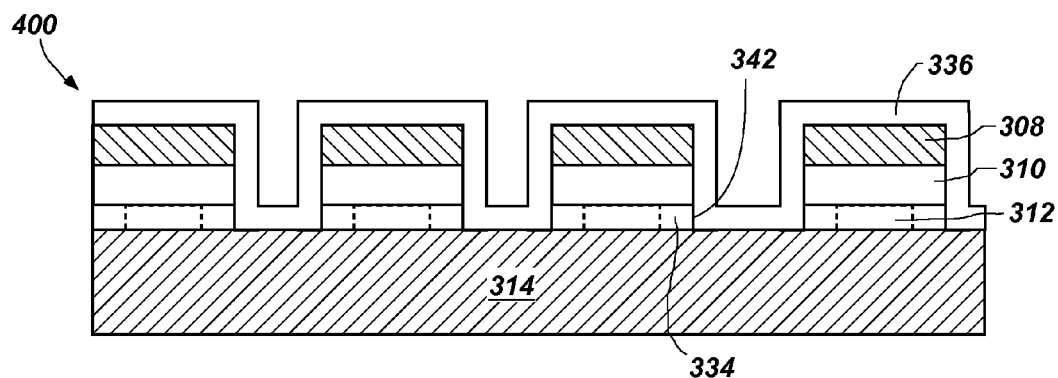
Figure 4D:
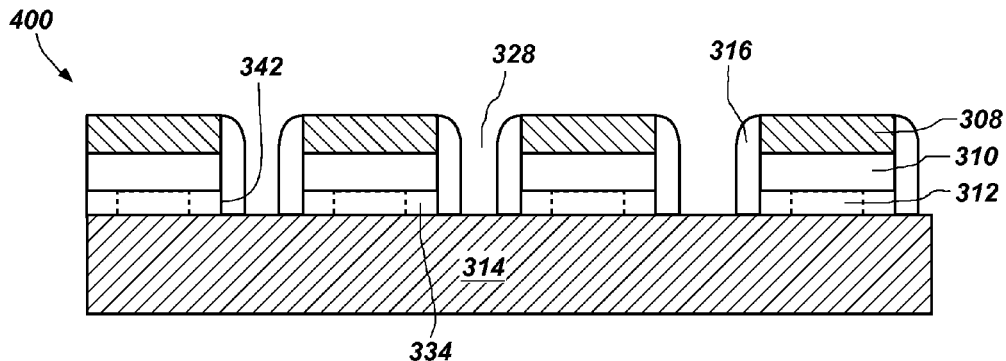

As shown in FIG. 4C, after forming openings 328 and, optionally, forming undercuts 334 and filling the undercuts 334 with the sacrificial material 342, a spacer material 336 may be applied over the workpiece 400. By way of non-limiting example, the spacer material 336 may include silicon dioxide or silicon nitride, and may be formed using an atomic layer deposition (ALD) process, or a chemical vapor deposition (CVD) process. During deposition of the spacer material 336, the optional sacrificial material 342 may prevent the spacer material 336 from being deposited in the optional undercuts 334. A conventional spacer etch may then be performed, as previously described with respect to FIG. 3E, to form the workpiece 400 including spacers 316 as shown in FIG. 4D. The spacers 316 may cover the another conductive material 308, the another dielectric material 310, and either the dielectric material 312 or the sacrificial material 342, filling the optional undercuts 334 exposed along the sidewalls 332 of the openings 328.

Figure 4E:
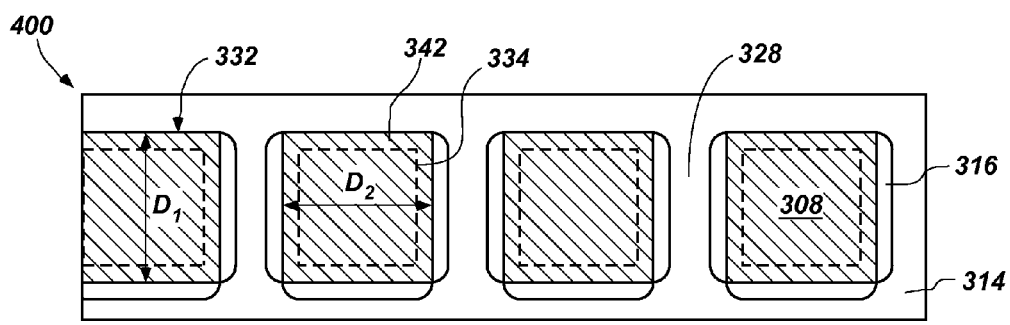

Referring to FIG. 4D, after forming the spacers 316, at least one of the spacers 316 may be removed from the sidewalls 332 to expose a portion of the dielectric material 312 or, if present, a portion of the sacrificial material 342, which is represented by broken lines. Removal of at least one of the spacers 316 may be performed by way of conventional patterning techniques (e.g., masking and etching), which are not described in detail herein. By way of non-limiting example, a mask (not shown) may be applied and selectively patterned to expose a surface of at least one of the spacers 316 through the mask, and at least one of the spacers 316 may be removed using, for example, a wet chemical etching process. FIG. 4E is a top-down view of the workpiece 400 shown in FIG. 4F after removal of one of the spacers 316 to expose at least one of the sidewalls 332.

Figure 4F:
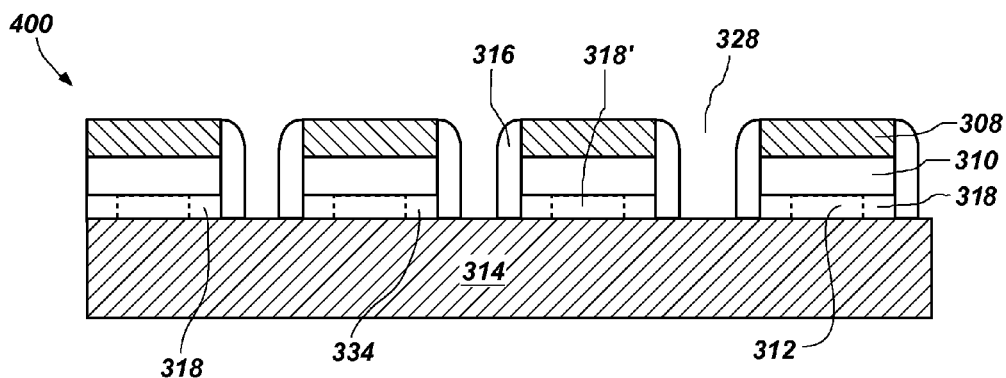

Referring to FIG. 4F, subsequent to removal of at least one of the spacers 316, exposed portions of the sacrificial material 342, if present, and the dielectric material 312 may be removed to form an open volume 318. As a non-limiting example, an anisotropic dry reactive ion (i.e., plasma) etching process may be used to selectively remove the sacrificial material 342 (FIGS. 4D and 4E) without removing the dielectric material 312 to form the open volume 318 extending only partially into the dielectric material 312, as represented by broken lines. Additionally, the dielectric material 312 may be substantially completely removed using, for example, an anisotropic dry reactive ion (i.e., plasma) etching process so as to form an open volume 318' exposing opposing surfaces of the dielectric material and the another metal between the spacers 316.

Figure 5A:
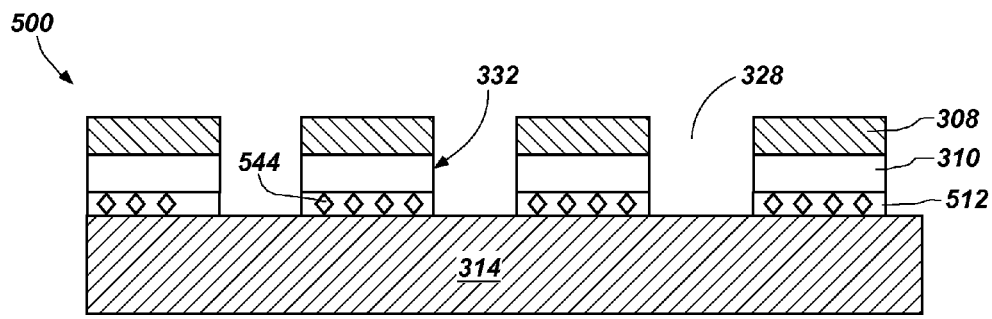
FIGS. 5A-5C are partial cross-sectional side views of embodiments of a workpiece and illustrate yet another embodiment of a method of forming the select device shown in FIGS. 1A and 1B.

Yet another embodiment of a method that may be used to form an embodiment of a select device 102, such as that shown in FIGS. 1A and 1B, is described below with reference to FIGS. 5A-5C. Referring to FIG. 5A, a workpiece 500 may be provided, which includes a conductive material 314, a dielectric material 512, another dielectric material 310, and another conductive material 308. The conductive material 314 may include a metal having a low work function such as those previously described with respect to FIG. 3A. The dielectric material 512 may include an oxide such as silicon dioxide ($SiO_2$), a nitride such as silicon nitride ($Si_3N_4$), amorphous carbon, or aluminum oxide ($Al_2O_3$), and may include a plurality of nanodots 544, which may be distributed throughout the dielectric material 512. The nanodots 544 may include, for example, silicon particles or metal particles having an average diameter of between about 5 Å and about 20 Å.

With continued reference to FIG. 5A, the another dielectric material 310 and the conductive material 308 may be formed over the workpiece 500, and plurality of openings 328 may be formed using methods identical or substantially similar to those previously described in relation to FIGS. 3B and 3C.

Figure 5B:
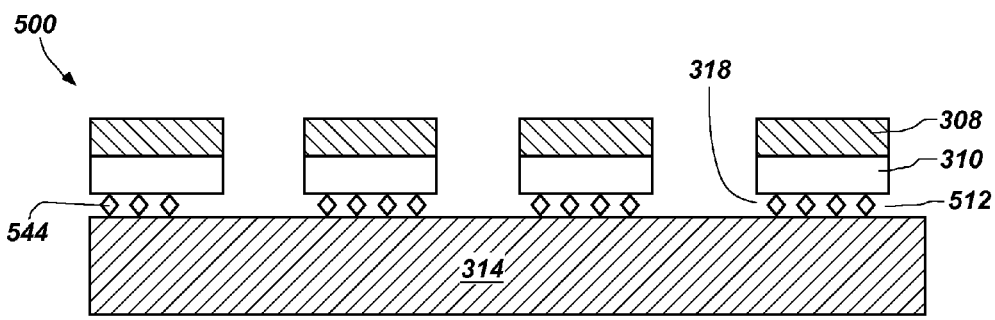

As shown in FIG. 5B, the dielectric material 512 may be removed so that the nanodots 544 support overlying portions of the another dielectric material 310 and the conductive material 308. By way of non-limiting example, the dielectric material 512 is amorphous carbon, the nanodots 544 are formed from a metal, and the carbon may be removed using an anisotropic oxygen plasma etch, while the nanodots 544 remain between surfaces of the another dielectric material 310 and the another conductive material 314. Removal of the dielectric material 512 results in the formation of open volume 318, which may function as an insulator having a dielectric constant of about 1 to reduce parasitic capacitance.

Figure 5C:
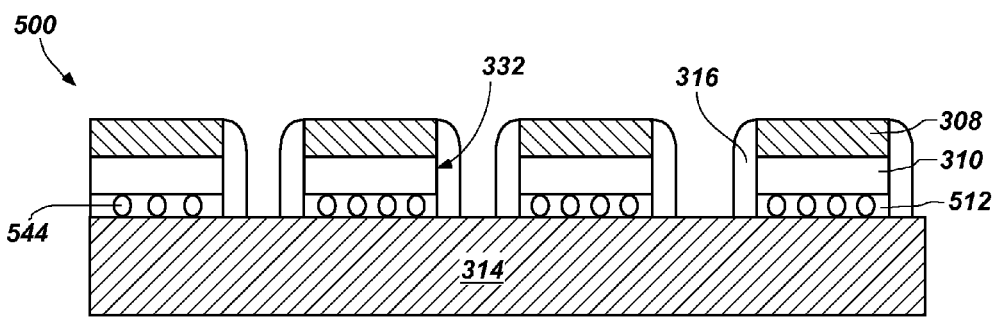

Referring to FIG. 5C, spacers 316 may be formed over the sidewalls 332 of the another conductive material 308, the another dielectric material 310, the dielectric material 312 using methods previously described with respect to FIG. 3E to enclose and provide additional support for the open volume 318.

EXAMPLE

Figure 6:
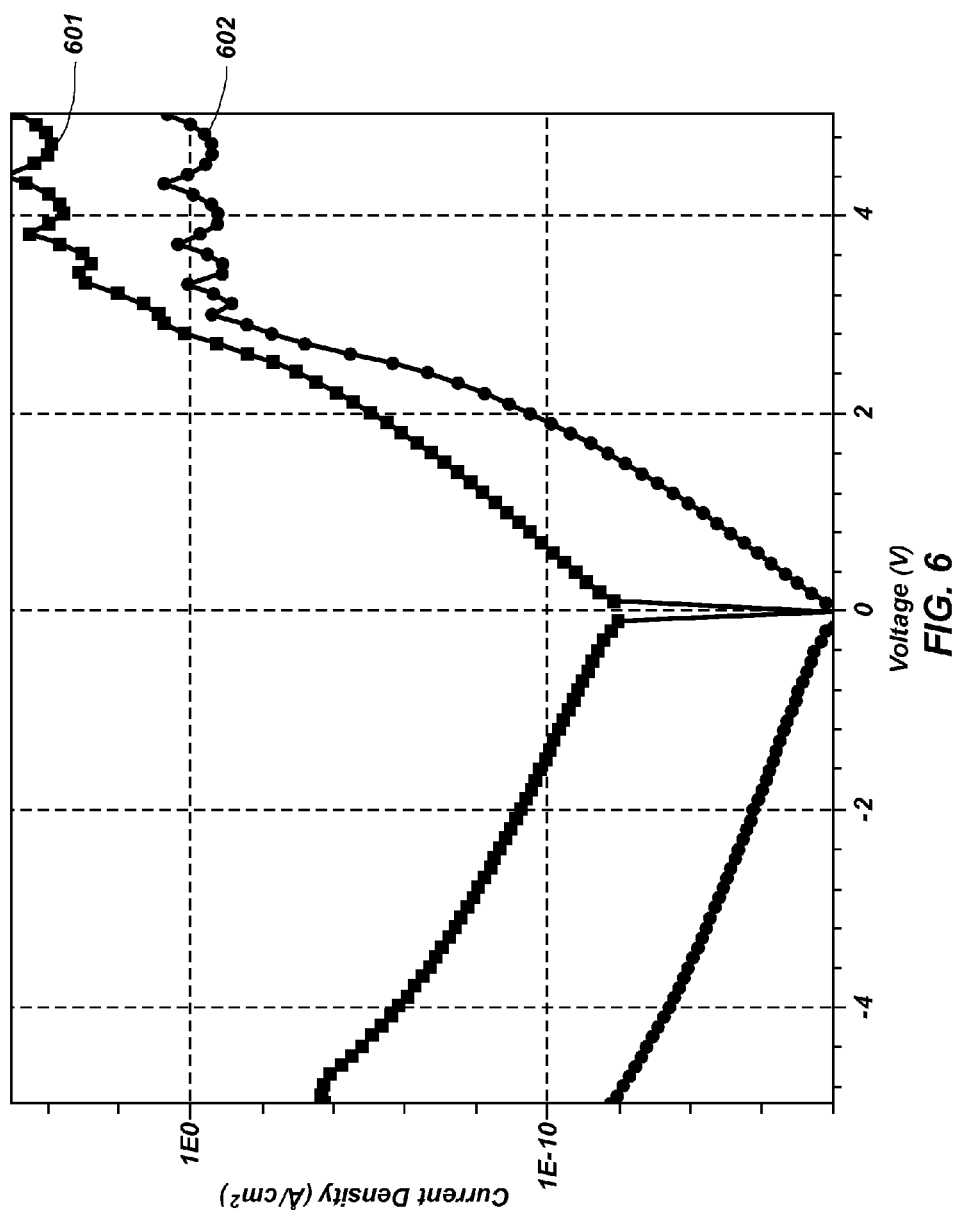
FIG. 6 is a graph showing a comparison between a current-voltage (I-V) relationship for a select device of the present invention and a conventional select device.

FIG. 6 shows a comparison of voltage-current density characteristics of a conventional select device 601 and of a select device including an open volume 602, such as the select device (102) shown in FIGS. 1A and 1B. Each of the select devices 601 and 602 may include a first electrode and a second electrode, which are spaced-apart from one another by a first insulator and a second insulator. The first insulator may be disposed over the second electrode, and the second insulator may be disposed between the first insulator and the first electrode. The first electrode may include a metal having a work function of about 4.40, the second electrode may include a metal having a work function of about 5.25, and the second insulator may include a nanolaminate dielectric comprising hafnium oxide ($HfO_2$) and zirconium oxide ($ZrO_2$). The conventional select device 601 may include a first insulator comprising silicon dioxide and, in contrast, the select device 602 may include a first insulator comprising an open volume.

When driving voltages are the same as applied to both select devices, current density of select device 601 is larger than that of select device 602. In other words, when current densities are the same, driving voltage of select device 602 is smaller than that of select device 601. In forward bias, a quantum well may form between the first insulator and the second insulator resulting in the forward curves shown in FIG. 6. For select device 602, the forward curve exhibits a dramatically sharper nonlinear current-voltage characteristic in comparison to the forward curve for select device 601, demonstrating decreased resistance and increased rectifying behavior. Therefore, utilizing an open volume as a first insulator in a select device results in a select device exhibiting increased nonlinearity and a highly asymmetric current-voltage characteristic.

While the invention may be susceptible to various modifications and alternative forms, specific embodiments have been shown by way of example in the drawings and have been described in detail herein. However, it should be understood that the invention is not limited to the particular forms disclosed. Rather, the invention encompasses all modifications, variations and alternatives falling within the scope of the invention as defined by the following appended claims and their legal equivalents.

What is claimed is:

1. A method of forming a select device, comprising:
   forming at least one structure comprising:
      a dielectric material on a surface of a conductive material;
      nanodots dispersed within the dielectric material, each of the nanodots spaced apart from each other of the nanodots within the dielectric material;
      another dielectric material overlying the dielectric material; and
      another conductive material overlying the another dielectric material;
   removing at least a portion of the dielectric material selective to the nanodots to form an open volume between opposing surfaces of the dielectric material and the conductive material; and
   forming opposing spacers on the surface of the conductive material and on sidewalls of the another conductive material and the another dielectric material such that the open volume is at least partially defined by the surface of the conductive material, an opposing surface of the another dielectric material, surfaces of the nanodots, and inner sidewalls of the opposing spacers substantially coplanar with the sidewalls of the another dielectric material and the another conductive material.

2. The method of claim 1, wherein forming at least one structure comprises:
   applying the another conductive material comprising at least one metal over the dielectric material, the another dielectric material, and the conductive material, the another conductive material having a work function lower than a work function of the conductive material; and
   removing a portion of the another conductive material, the dielectric material, and the another dielectric material to form an opening exposing surfaces of the conductive material.

3. A select device comprising:
   nanodots on a surface of a conductive material, each of the nanodots spaced apart from each other of the nanodots;
   a dielectric material overlying the nanodots;
   another conductive material overlying the dielectric material; and
   an open volume at least partially defined by the surface of the conductive material, an opposing surface of the dielectric material, surfaces of the nanodots, and inner sidewalls of opposing spacers substantially coplanar with sidewalls of the dielectric material and the another conductive material.

4. An electronic system comprising:
   at least one electronic signal processor;
   at least one memory device configured to communicate electrically with the at least one electronic signal processor, the at least one memory device comprising:
      at least one select device comprising:
         a conductive material;
         nanodots on a surface of the conductive material, each of the nanodots spaced apart from each other of the nanodots;
         a dielectric material over the nanodots;
         another conductive material over the dielectric material; and
         an open volume at least partially defined by the surface of the conductive material, an opposing surface of the dielectric material, surfaces of the nanodots, and inner sidewalls of opposing spacers substantially coplanar with sidewalls of the dielectric material and the another conductive material; and
   at least one of an input device and an output device configured to communicate electrically with the at least one electronic signal processor.

5. A memory device comprising:
   at least one memory element;
   a plurality of bit lines;
   at least one wordline; and
   at least one select device comprising:
      a conductive material;
      nanodots on a surface of the conductive material, each of the nanodots spaced apart from each other of the nanodots;
      a dielectric material over the nanodots;
      another conductive material over the dielectric material; and
      an open volume at least partially defined by the surface of the conductive material, an opposing surface of the dielectric material, surfaces of the nanodots, and inner sidewalls of opposing spacers substantially coplanar with sidewalls of the dielectric material and the another conductive material.

6. The method of claim 1, wherein forming at least one structure comprises forming the conductive material to underly an entire length of the another dielectric material.

7. The method of claim 1, wherein the conductive material comprises a metal.

8. The method of claim 1, wherein removing a portion of the dielectric material selective to the nanodots comprises exposing the dielectric material to an anisotropic oxygen plasma etch.

9. The method of claim 2, wherein removing a portion of the another conductive material, the dielectric material, and the another dielectric material comprises exposing the another conductive material, the dielectric material, and the another dielectric material to a chlorine-containing etchant.

10. The select device of claim 3, wherein the nanodots comprise a metal.

11. The select device of claim 3, wherein an average diameter of the nanodots is between about 5 Å and about 20 Å.

12. The select device of claim 3, wherein the open volume exhibits a dielectric constant of about 1.

13. The select device of claim 3, wherein the opposing spacers are disposed between the open volume and an additional dielectric material.

14. The select device of claim 3, wherein the open volume has a thickness between about 5 Å and about 20 Å.

15. The select device of claim 3, wherein the conductive material comprises at least one of tantalum silicide, an alloy of tantalum and silicon, and an alloy of tantalum and nitrogen.

16. The select device of claim 3, wherein the another conductive material comprises at least one of platinum, titanium, titanium nitride, rhodium, iridium, and ruthenium.

17. The select device of claim 3, wherein the dielectric material comprises a crystalline material comprising at least one of hafnium, zirconium, and tellurium.

18. The select device of claim 3, wherein the dielectric material comprises hafnium oxide and zirconium oxide.

19. The select device of claim 3, wherein the nanodots, the dielectric material, and the conductive material are each confined within lateral boundaries defined by the inner sidewalls of the opposing spacers.

20. The select device of claim 3, wherein the nanodots consist of a discontinuous monolayer of conductive particles on the surface of the conductive material.

\* \* \* \* \*